(12) United States Patent
Schäfer et al.

(10) Patent No.: US 8,950,652 B2
(45) Date of Patent: Feb. 10, 2015

(54) METAL PASTE WITH OXIDIZING AGENTS

(75) Inventors: Michael Schäfer, Künzell (DE);
Wolfgang Schmitt, Rodgau (DE); Jian Zeng, Lippstadt (DE)

(73) Assignee: Heraeus Materials Technology GmbH & Co. KG, Hanau (DE)

( * ) Notice: Subject to any disclaimer, the term of this patent is extended or adjusted under 35 U.S.C. 154(b) by 0 days.

(21) Appl. No.: 13/393,032

(22) PCT Filed: Sep. 3, 2010

(86) PCT No.: PCT/EP2010/005399
§ 371 (c)(1),
(2), (4) Date: Feb. 28, 2012

(87) PCT Pub. No.: WO2011/026623
PCT Pub. Date: Mar. 10, 2011

(65) Prior Publication Data
US 2012/0153011 A1 Jun. 21, 2012

(30) Foreign Application Priority Data
Sep. 4, 2009 (DE) .......................... 10 2009 040 076

(51) Int. Cl.
| | |
|---|---|
| *B23K 35/22* | (2006.01) |
| *B23K 35/26* | (2006.01) |
| *B23K 35/34* | (2006.01) |
| *B22F 1/00* | (2006.01) |
| *B22F 3/10* | (2006.01) |
| *B22F 7/04* | (2006.01) |
| *B23K 35/02* | (2006.01) |
| *B23K 35/36* | (2006.01) |
| *B23K 35/365* | (2006.01) |
| *H01L 23/00* | (2006.01) |

(52) U.S. Cl.
CPC ............... *B23K 35/34* (2013.01); *B22F 1/0062* (2013.01); *B22F 3/1003* (2013.01); *B22F 7/04* (2013.01); *B23K 35/025* (2013.01); *B23K 35/3602* (2013.01); *B23K 35/3618* (2013.01); *B23K 35/365* (2013.01); *H01L 24/83* (2013.01); *H01L 2224/8384* (2013.01); *H01L 2924/01004* (2013.01); *H01L 2924/01012* (2013.01); *H01L 2924/01013* (2013.01); *H01L 2924/01029* (2013.01); *H01L 2924/01032* (2013.01); *H01L 2924/01038* (2013.01); *H01L 2924/01047* (2013.01); *H01L 2924/01051* (2013.01); *H01L 2924/01056* (2013.01); *H01L 2924/01061* (2013.01); *H01L 2924/01073* (2013.01); *H01L 2924/01079* (2013.01); *H01L 2924/01082* (2013.01); *H01L 2924/01005* (2013.01); *H01L 2924/01006* (2013.01); *H01L 2924/01019* (2013.01); *H01L 2924/0102* (2013.01); *H01L 2924/01033* (2013.01); *H01L 2924/01078* (2013.01); *H01L 2924/13055* (2013.01); *H01L 2924/10253* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01)
USPC ..................... 228/248.1; 228/56.3; 228/179.1; 148/23; 148/24; 75/252

(58) Field of Classification Search
USPC .............. 228/56.3, 179.1; 75/252; 148/23, 24
See application file for complete search history.

(56) References Cited

U.S. PATENT DOCUMENTS

| | | | | |
|---|---|---|---|---|
| 3,091,027 | A * | 5/1963 | Clair | 228/121 |
| 6,951,666 | B2 * | 10/2005 | Kodas et al. | 427/376.6 |
| 7,766,218 | B2 * | 8/2010 | Yamakawa et al. | 228/248.1 |
| 7,926,700 | B2 | 4/2011 | Schmitt et al. | |
| 7,955,411 | B2 * | 6/2011 | Yasuda et al. | 75/228 |
| 8,513,534 | B2 * | 8/2013 | Morita et al. | 174/255 |

(Continued)

FOREIGN PATENT DOCUMENTS

| | | |
|---|---|---|
| DE | 102005053553 A1 | 5/2007 |
| DE | 102007046901 A1 | 4/2009 |

(Continued)

OTHER PUBLICATIONS

Int'l Search Report issued Jan. 21, 2011 in Int'l Application No. PCT/EP2010/005399.

(Continued)

*Primary Examiner* — Devang R Patel
(74) *Attorney, Agent, or Firm* — Panitch Schwarze Belisario & Nadel LLP

(57) ABSTRACT

A sintering method is provided which allows components to be joined to each other in a stable way, wherein the processing temperature is less than 200° C. and stable contact points are produced, which have low porosity and also high electrical and thermal conductivity. The method for joining components includes (a) providing a sandwich arrangement having at least (a1) one component 1, (a2) one component 2, and (a3) a metal paste located between component 1 and component 2, and (b) sintering the sandwich arrangement. The metal paste contains (A) 75-90 weight percent of at least one metal present in the form of particles having a coating containing at least one organic compound, (B) 0-12 weight percent of at least one metal precursor, (C) 6-20 weight percent of at least one solvent, and (D) 0.1-15 weight percent of at least one sintering agent selected from the group comprising (i) organic peroxides, (ii) inorganic peroxides, and (iii) inorganic acids.

5 Claims, No Drawings

(56) References Cited

U.S. PATENT DOCUMENTS

| | | |
|---|---|---|
| 2007/0178232 A1 | 8/2007 | Kodas et al. |
| 2007/0207565 A1 | 9/2007 | Kodas et al. |
| 2009/0078747 A1* | 3/2009 | Park et al. .................... 228/249 |
| 2009/0152331 A1* | 6/2009 | Schmitt et al. ................ 228/256 |
| 2011/0064937 A1* | 3/2011 | Mukoyama et al. ....... 428/312.6 |

FOREIGN PATENT DOCUMENTS

| | | | |
|---|---|---|---|
| JP | 11012551 A | * | 1/1999 |
| JP | 2001207033 A | * | 7/2001 |
| JP | 2004-283841 A | | 10/2004 |
| WO | 9520460 A1 | | 8/1995 |
| WO | 2005079353 A2 | | 9/2005 |

OTHER PUBLICATIONS

Office Action issued Sep. 29, 2010 in DE Application No. 10 2009 040 076.1.

Examination Report issued Mar. 13, 2013 in SG Application No. 201200924-7.

* cited by examiner

METAL PASTE WITH OXIDIZING AGENTS

CROSS-REFERENCE TO RELATED APPLICATIONS

This application is a Section 371 of International Application No. PCT/EP2010/005399, filed Sep. 3, 2010, which was published in the German language on Mar. 10, 2011, under International Publication No. WO 2011/026623 A1 and the disclosure of which is incorporated herein by reference.

BACKGROUND OF THE INVENTION

The present invention relates to a metal paste and a method for joining components in which this metal paste is used.

Joining components, such as LEDs or very thin silicon chips, which exhibit a high sensitivity to pressure and temperature, represents a particular challenge in the field of power electronics.

For this reason, such components that are sensitive to pressure and temperature are often joined to each other by adhesion. The adhesive technique, however, has the disadvantage that it produces contact points between the components that exhibit only inadequate heat conduction or electrical conductivity.

To solve this problem, the components to be joined are frequently sintered. The sintering technique represents a very simple method for the stable joining of components.

Conventional sintering methods, however, require either a high processing pressure or else a high processing temperature. These conditions often result in damage to the components to be joined, so that conventional sintering methods must be ruled out for many applications.

In German published patent application DE 10 2007 046 901 A1 a sintering technique is proposed, with which it is possible to build joining layers with very good electrical-conductivity and heat-conduction properties for power electronics. In this sintering method a metal paste is used containing a silver compound, which decomposes into elementary silver below 300° C. These metal pastes allow a reduction of the processing pressure to below 3 bar and a reduction of the processing temperature to below 250° C. This sintering technique represents a large leap in quality in joining components that are sensitive to pressure and temperature.

However, for many applications it would be desirable if the processing temperature could be lowered even further. A lower temperature would lead to smaller loading of the components to be joined and thus to a further increase in the quality of the components in the field of power electronics. In addition, with a further decrease of the processing temperature, considerable amounts of energy costs could also be saved.

BRIEF SUMMARY OF THE INVENTION

The present invention is therefore based on the object of providing a sintering method that allows components to be joined to each other in a stable way, wherein the processing temperature is below 200° C. This method should produce contact points between the components to be joined, which exhibit low porosity and a high electrical and thermal conductivity.

Another object of the present invention consists in providing a metal paste, which can be used in the sintering method according to the invention and which allows a lowering of the processing temperature to below 200° C. and the formation of contact points between the components to be joined having low porosity and high electrical thermal conductivity.

These objects are achieved by a method for joining components in which (a) a sandwich arrangement is prepared having at least (a1) a component 1, (a2) a component 2, and (a3) a metal paste located between component 1 and component 2, and (b) the sandwich arrangement is sintered, characterized in that the metal paste comprises (A) 75-90 weight percent of at least one metal present in the form of particles having a coating containing at least one organic compound, (B) 0-12 weight percent of at least one metal precursor, (C) 6-20 weight percent of at least one solvent, and (D) 0.1-15 weight percent of at least one sintering agent selected from the group comprising (i) organic peroxides, (ii) inorganic peroxides, and (iii) inorganic acids.

Furthermore, a metal paste is provided, which contains (A) 75-90 weight percent of at least one metal present in the form of particles having a coating containing at least one organic compound, (B) 0-12 weight percent of at least one metal precursor, (C) 6-20 weight percent of at least one solvent, and (D) 0.1-15 weight percent of at least one sintering agent selected from the group comprising (i) organic peroxides, (ii) inorganic peroxides, and (iii) inorganic acids.

In addition, the invention relates to the use of a sintering agent selected from the group comprising (i) organic peroxides, (ii) inorganic peroxides, and (iii) inorganic acids for a sintering process for joining components that contact each other via the metal paste in a sandwich arrangement.

DETAILED DESCRIPTION OF THE INVENTION

The following explanations are not intended to limit the invention, but to offer only one possible explanation for the mode of operation of the invention.

The present invention is based on the knowledge that it is advantageous for the sintering of components by the use of metal pastes if the particles contained in the metal paste are coated, preferably with fatty acids. If the metal particles are not coated, then the metal particles agglomerate in the metal paste and form clumps in an early stage during the sintering process. This situation often results in inhomogeneous contact points between the components to be joined.

Surprisingly, however, it was discovered that such coated metal particles are also the reason that the sintering temperature cannot be lowered below 200° C. As long as the coating compounds are on the surface of the metal particles, on one hand an agglomeration of the metal particles is indeed prevented. But on the other hand, the surfaces of the metal particles are not available for the sintering process, so that the metal particles cannot be sintered.

In conventional sintering methods, the coating compounds are burned off in the course of the sintering process at the temperatures of far above 200° C. typically used for sintering. Only after the coating compounds have burned off are the surfaces of the metal particles accessible for the sintering process. Therefore, sintering processes with conventionally used, coated metal particles are possible only at temperatures far above 200° C.

Surprisingly, it was found that certain sintering agents ensure that the coating compounds are burned off at temperatures below 200° C. These sintering agents preferably comprise oxygen-containing oxidizing agents, which ensure that the coating compounds contained on the metal particles are removed at temperatures below 200° C. Thus, even at temperatures below 200° C., the surfaces of the metal particles are available for the sintering process. It was also surprising that, despite the coating compounds being burned off at temperatures below 200° C., the metal particles did not agglomerate, but instead produced homogeneous and stable contact points between the components to be connected.

Moreover, it was also surprisingly found that the surface of the metal particles lying under the coating layer was at least partially oxidized. Such metal oxide layers negatively affect the diffusion processes required for the sintering and thus slow down the diffusion rate. For this reason, conventionally it has been necessary to use high processing temperatures of far above 200° C., when sintering by these metal particles oxidized at the surface.

According to the invention, burning away the coating compounds produces, among other things, carbon monoxide. The carbon monoxide released during sintering is a reducing agent and as such is able to reduce the metal oxide on the surface of the metal particles. Removing the metal oxide ensures an obstacle-free diffusion and thus, along with this condition, an increase in the diffusion rate. In this reduction of the metal oxide, in situ reactive metal is also generated, which further promotes the sintering process. Moreover, during the sintering process this reactive metal can fill voids between the metal atoms of the metal particles and thus significantly lower the porosity of the contact point between the components to be joined. Extremely stable, heat-conductive, and also electrically conductive contact points are thereby produced.

Thus, by the use of sintering agents according to the invention, the processing temperature during sintering can be significantly reduced. Here it is surprising that, despite the burning away of the coating compounds at temperatures below 200° C., the metal particles do not agglomerate, but instead homogeneous and stable contact points result between the components to be joined.

The effects described above appear to have the result that, when the sintering agents are used, the sintering temperature can be lowered to below 200° C., and nevertheless stable, heat-conductive and electrically conductive contact points can be generated between the components to be joined by the sintering process.

The use of metal pastes in a sintering process for joining components is known in the field of power electronics.

According to the invention, the metal paste contains at least one metal.

In the present case, the term metal encompasses both pure metals and also metal alloys.

In the scope of the invention, the term metal refers to an element that, in the periodic table of elements, is in the same period as boron but is left of boron, is in the same period as silicon but is left of silicon, is in the same period as germanium but is left of germanium, and is in the same period as antimony but is left of antimony, as well as to all elements having a higher atomic number than 55.

According to the invention, pure metals are understood to be metals containing a metal having a purity of at least 95 weight percent, preferably at least 98 weight percent, more preferably at least 99 weight percent, and even more preferably at least 99.9 weight percent.

According to one preferred embodiment, the metal comprises copper, silver, gold, nickel, palladium, platinum, or aluminum.

According to the invention, metal alloys are understood to be metallic mixtures made of at least two components, of which at least one is a metal.

According to one preferred embodiment according to the invention, an alloy that contains copper, aluminum, nickel, and/or precious metals is used as the metal alloy. The metal alloy preferably comprises at least one metal selected from the group comprising copper, silver, gold, nickel, palladium, platinum, and aluminum. Especially preferred metal alloys contain at least two metals selected from the group comprising copper, silver, gold, nickel, palladium, platinum, and aluminum. It can be further preferred that the percentage of metals selected from the group comprising copper, silver, gold, nickel, palladium, platinum, and aluminum in the metal alloy is at least 90 weight percent, preferably at least 95 weight percent, more preferably at least 99 weight percent, and even more preferably 100 weight percent. The alloy can comprise, for example, an alloy containing copper and silver, copper, silver and gold, copper and gold, silver and gold, silver and palladium, platinum and palladium, or nickel and palladium.

As the metal, the metal paste according to the invention can contain a pure metal, several types of pure metals, a type of metal alloy, several types of metal alloys, or mixtures thereof.

The metal is present in the metal paste in the form of particles.

The metal particles can have different forms. For example, the metal particles can be provided in the form of flakes or a spherical (ball-like) shape. According to one especially preferred embodiment, the metal particles have the form of flakes. This does not rule out, however, that even a minor percentage of the metal particles being used can have a different form. However, it is preferred that at least 70 weight percent, more preferably at least 80 weight percent, even more preferably at least 90 weight percent, or 100 weight percent of the particles are provided in the form of flakes.

According to the invention, the metal particles are coated.

According to the invention, a coating of particles is understood to be a firmly bonded layer on the surface of the particles.

According to the invention, the coating of the metal particles contains at least one type of coating compound.

These coating compounds comprise organic compounds.

According to the invention, the organic compounds used as coating compounds comprise carbon-containing compounds that prevent agglomeration of the metal particles.

According to one preferred embodiment, the coating compounds have at least one functional group. As functional groups the following can be considered in particular: carboxylic acid groups, carboxylate groups, ester groups, keto groups, aldehyde groups, amino groups, amide groups, azo groups, imide groups, cyano groups, or nitrile groups. Preferred functional groups are carboxylic acid groups and ester groups. The carboxylic acid group can be deprotonated.

The coating compounds having at least one functional group preferably comprise saturated, monounsaturated, or polyunsaturated organic compounds.

Moreover, these coating compounds having at least one functional group can be branched or unbranched.

The coating compounds according to the invention having at least one functional group have preferably 1-50, more preferably 2-24, even more preferably 6-24, and even more preferably 8-20 carbon atoms.

The coating compounds can be ionic or nonionic.

Preferably, free fatty acids, fatty acid salts, or fatty acid esters are used as the coating compounds.

The free fatty acids, fatty acid salts, and fatty acid esters are preferably unbranched.

Moreover, the free fatty acids, fatty acid salts, or fatty acid esters are preferably saturated.

Preferred fatty acid salts are the salts of ammonium, monoalkyl ammonium, dialkyl ammonium, trialkyl ammonium, aluminum, copper, lithium, sodium, and potassium.

Preferred esters are alkyl ester, in particular methyl ester, ethyl ester, propyl ester, and butyl ester.

According to one preferred embodiment, the free fatty acids, fatty acid salts, or fatty acid esters comprise compounds having 8-24, more preferably 10-24, and even more preferably 12-18 carbon atoms.

Preferred coating compounds are caprylic acid (octanoic acid), capric acid (decanoic acid), lauric acid (dodecanoic acid), myristic acid (tetradecanoic acid), palmitic acid (hexadecanoic acid), margaric acid (heptadecanoic acid), stearic acid (octadecanoic acid), arachidic acid (eicosanoic acid/icosanoic acid), behenic acid (docosanoic acid), lignoceric acid (tetracosanoic acid), as well as the corresponding esters and salts.

Especially preferred coating compounds are dodecanoic acid, octadecanoic acid, aluminum stearate, copper stearate, sodium stearate, potassium stearate, sodium palmitate, and potassium palmitate.

The coating compounds used according to the invention are deposited on the surface of the metal particles by conventional methods known from the prior art.

For example, it is possible to slurry the coating compounds, in particular the previously mentioned stearates or palmitates, in solvents and to grind the slurried coating compounds in ball mills with the metal particles. After the grinding, the metal particles now coated with the coating compounds are dried and then freed from dust.

Preferably, the portion of organic compounds, especially the portion of compounds selected from the group comprising free fatty acids, fatty acid salts, and fatty acid esters preferably having 8-24, more preferably 10-24, and even more preferably 12-18 carbon atoms, in the entire coating equals at least 60 weight percent, more preferably at least 70 weight percent, even more preferably at least 80 weight percent, even more preferably at least 90 weight percent, in particular at least 95 weight percent, at least 99 weight percent, or 100 weight percent.

Typically, the portion of coating compounds, preferably the coating compounds selected from the group comprising free fatty acids, fatty acid salts, and fatty acid esters having 8-24, more preferably 10-24, and even more preferably 12-18 carbon atoms, equals 0.01-2 weight percent, preferably 0.3-1.5 weight percent, more preferably 0.4-1.4 weight percent, and even more preferably 0.5-1.0 weight percent, based on the weight of the coated metal particles.

The degree of coating, defined as the ratio of the mass of coating compounds to surface area of metal particles, preferably equals 0.00005-0.03 g, more preferably 0.0001-0.02 g, and even more preferably 0.0005-0.02 g of coating compounds per square meter ($m^2$) surface area of metal particles.

The metal paste according to the invention comprises, in addition to the coated metal particles, preferably at least one metal precursor.

In the scope of the invention, a metal precursor is understood to be a compound that contains at least one metal. Preferably, it comprises a compound that decomposes at temperatures below 200° C., while releasing a metal. Preferably, by using a metal precursor in the sintering process, a metal is accordingly formed in situ. It can be determined in a simple way whether a compound comprises a metal precursor according to this preferred embodiment. For example, a paste containing a compound to be tested can be deposited on a substrate having a silver surface, heated to 200° C., and left at this temperature for 20 minutes. Then it is tested whether, under these conditions, the compound to be tested has decomposed into a metal. For this purpose, for example, before the test the content of the metal-containing paste components can be weighed, and from this content the theoretical mass of the metal can be calculated. After the test the mass of the material deposited on the substrate is determined gravimetrically. If the mass of the material deposited on the substrate corresponds to the theoretical mass of the metal, wherein typical measurement deviations must be taken into account, then the tested compound comprises a metal precursor according to this preferred embodiment.

According to one preferred embodiment, the metal precursor comprises a metal precursor that can be decomposed endothermally. According to the invention, a metal precursor that can be decomposed endothermally is understood to be a metal precursor whose thermal decomposition takes place in an endothermic process, preferably under a protective gas atmosphere. Metal should be released from the metal precursor in this thermal decomposition.

According to another preferred embodiment, the metal precursor has a metal also contained in a metal powder.

Preferably, the metal precursor comprises as the metal at least one element selected from the group comprising copper, silver, gold, nickel, palladium, and platinum.

It can be preferred to use as the metal precursor endothermically decomposable carbonates, lactates, formates, citrates, oxides, or fatty acid salts, preferably fatty acid salts having 6 to 24 carbon atoms, of the mentioned metals.

In special embodiments, silver carbonate, silver(I) lactate, silver(II) formate, silver citrate, silver oxide (for example AgO or $Ag_2O$), copper(II) lactate, copper stearate, copper oxide (for example $Cu_2O$ or CuO) or gold oxide (for example $Au_2O$ or AuO) is used as the metal precursor.

According to one especially preferred embodiment, silver carbonate, silver(I) oxide, or silver(II) oxide is used as the metal precursor.

If present, the metal precursor in the metal paste preferably exists in the form of a powder that consists of particles.

The particles of the powder can have the shape of flakes or a spherical (ball-like) shape. Preferably, however, the particles of the metal precursor exist as flakes.

The use of a metal precursor that releases metal in situ during the sintering process has the result that the metal formed in situ during the sintering process closes gaps between the metal particles contained in the metal paste. In this way, the porosity of a contact point between two components to be joined can be reduced.

The metal paste according to the invention further contains at least one solvent.

According to the invention, solvents are understood to be compounds that can produce by physical processes a solution from other compounds. These other compounds, however, preferably do not involve the metal of the metal paste.

According to the invention, solvents typically used for metal pastes can be considered for use as solvents.

Preferably, organic compounds are used as solvents, which have at least one heteroatom and 6-24 carbon atoms, more preferably 8-20 carbon atoms.

These organic compounds can be branched or unbranched. The organic compounds can also comprise cyclic compounds.

Furthermore, the organic compounds used as solvents can be saturated, monounsaturated, or polyunsaturated compounds.

The at least one heteroatom contained in the organic compounds usable as solvents is preferably selected from the group comprising oxygen atoms and nitrogen atoms.

The at least one heteroatom can be part of at least one functional group. As functional groups, preferably hydroxyl groups, carboxylic acid groups, ester groups, keto groups, aldehyde groups, amino groups, amide groups, azo groups, imide groups, cyano groups, or nitrile groups can be considered.

According to one especially preferred embodiment, the solvent being used comprises an alcohol.

According to one especially preferred embodiment, α-terpineol ((R)-(+)-α-terpineol, (S)-(−)-α-terpineol or racemate), β-terpineol, γ-terpineol, δ-terpineol, mixtures of the above terpineols, N-methyl-2-pyrrolidone, ethylene glycol, dimethylacetamide, 1-tridecanol, 2-tridecanol, 3-tridecanol, 4-tridecanol, 5-tridecanol, 6-tridecanol, isotridecanol, and mixtures of these isotridecanols, dibasic ester (preferably dimethyl ester of glutaric, adipic or succinic acid or mixtures thereof), glycerin, diethylene glycol, triethylene glycol, or mixtures hereof are used as the solvent.

Preferably, the solvent being used is able to dissolve the sintering agent contained in the metal paste.

To allow a lowering of the sintering temperature to below 200° C., at least one sintering agent is contained in the metal paste according to the invention.

These sintering agents ensure that the coating compounds present on the particles of the metal contained in the metal paste burn away at temperatures below 200° C. during the sintering process.

These sintering agents preferably comprise oxidizing agents. An oxidizing agent is understood to be a substance that can oxidize other substances and is thereby reduced itself. An oxidizing agent can absorb electrons and is thus an electron acceptor.

Preferably, the sintering agent is also an oxygen carrier. Thus, a substance is meant that can give off oxygen.

In the scope of the invention (i) organic peroxides, (ii) inorganic peroxides, and (iii) inorganic acids can be used as the sintering agents. These compounds can be used as sintering agents, because they contain at least one oxygen atom and enable a combustion of the coating compounds, which are present on the metal particles of the metal paste, at a temperature below 200° C.

In the scope of the invention, organic peroxides are understood to be compounds that contain the peroxide anion $O_2^{2-}$ or the peroxide group —O—O— as well as at least one organic radical that is linked directly to the peroxide group. In the scope of the invention organic peroxides can thus also contain inorganic radicals linked directly to the peroxide group, as long as at least one organic radical is present that is linked directly to the peroxide group. This linking is preferably of a covalent nature.

Organic radicals are preferably understood to be radicals that contain at least one carbon atom, wherein the carbon atom is linked directly to the peroxide group, preferably by a covalent bond.

According to a preferred embodiment, the organic peroxides that can be used according to the invention comprise hydroperoxides, as well as peroxycarboxylic acids and their salts. Peroxycarboxylic acids are derived from carboxylic acids, wherein preferably the hydroxyl group of the carboxylic acid unit is replaced by a hydroxyperoxyl group. Hydroperoxides are formally derived, in turn, from ethers or alcohols, wherein the oxygen bridge connecting the alkyl, alkenyl, or aryl radicals to each other or to a hydrogen atom is replaced by a peroxide group.

The organic peroxides used according to the invention have at least one peroxide group. Thus they can also have two or more peroxide groups.

In the organic peroxide used according to the invention, the organic radicals can be of the same or different type.

The organic radicals can carry heteroatoms themselves. In this case, the heteroatoms preferably comprise oxygen atoms, nitrogen atoms, or halogen atoms. If the organic radicals contain halogen atoms, then fluorine atoms, chlorine atoms, bromine atoms, or iodine atoms are preferred. The heteroatoms can also be part of a functional group. As the functional groups, preferably carboxylic acid groups, ester groups, keto groups, aldehyde groups, hydroxyl groups, amino groups, amide groups, azo groups, imide groups, cyano groups, or nitrile groups can be considered.

The organic radicals of the organic peroxides preferably have 1-20, more preferably 2-15, and even more preferably 2-10 carbon atoms.

The organic radicals can be branched or unbranched.

The organic radicals can comprise aliphatic or aromatic radicals.

In the case of aliphatic radicals, the organic radical can also have a cyclic radical. The ring of the cyclic radical preferably consists of 4-8 atoms, wherein it can preferably comprise carbon atoms. The ring of the cyclic radical, however, can also contain heteroatoms, preferably one or more nitrogen atoms or oxygen atoms.

In the case of aromatic radicals, the organic radical can have aromatic groups having preferably 5 or 6 carbon atoms.

The organic radicals can be saturated or unsaturated. Accordingly, the organic radicals can contain multiple bonds, preferably double bonds, but also triple bonds.

The organic peroxides can also contain at least one inorganic radical linked directly to the peroxide group.

According to the invention, inorganic radicals are understood to be radicals linked to the peroxide group of the organic peroxide, wherein the linking is not realized by a carbon atom.

The linking of the inorganic radical to the peroxide group of the organic peroxide can be realized, in principle, by any atoms except carbon atoms. The linking is realized by a hydrogen atom or a heteroatom. As a heteroatom, metal atoms or nitrogen atoms can be preferred.

If heteroatoms are linked directly to the peroxide group, then the heteroatom can be part of a radical that contains other atoms in addition to the heteroatom. These additional atoms can preferably comprise carbon atoms, hydrogen atoms, or other heteroatoms. As other heteroatoms, nitrogen atoms, oxygen atoms, phosphorus atoms, and halogen atoms, as for example fluorine atoms, chlorine atoms, bromine atoms, or iodine atoms, can be preferred.

As metal atoms, which can be linked directly to the peroxide group, preferably metals of the first, second, and third groups of the periodic table of elements can be considered. According to one preferred embodiment, lithium atoms, sodium atoms, potassium atoms, beryllium atoms, magnesium atoms, calcium atoms, strontium atoms, boron atoms, or aluminum atoms are linked to the peroxide group.

The inorganic radical linked via a heteroatom to the peroxide group can preferably comprise an ammonium radical. It can also be preferred that one or more hydrogen atoms of the ammonium radical are substituted by organic or inorganic groups. Preferably, one or more hydrogen atoms of the ammonium radical are replaced by alkyl groups. These alkyl groups can be branched or unbranched, but are preferably unbranched. The alkyl groups that substitute for one or more hydrogen atoms of the ammonium radical preferably have 1-10, more preferably 1-6, and even more preferably 1-4 carbon atoms. The alkyl groups that substitute for one or more hydrogen atoms of the ammonium radical can be of the same or different type.

Preferred inorganic radicals are ammonium radicals, monomethyl ammonium radicals, dimethyl ammonium radicals, trimethyl ammonium radicals, monoethyl ammonium radicals, diethyl ammonium radicals, triethyl ammonium radicals, monopropyl ammonium radicals, dipropyl ammonium radicals, tripropyl ammonium radicals, monoisopropyl ammonium radicals, diisopropyl ammonium radicals, triisopropyl ammonium radicals, monobutyl ammonium radicals, dibutyl ammonium radicals, and tributyl ammonium radicals.

The organic peroxide used according to the invention can also comprise a cyclic organic peroxide. In particular, the peroxide group of the organic peroxide can itself be part of a cyclic system.

The organic peroxides used according to the invention preferably have a decomposition temperature of below 200° C. In this context, however, it was determined surprisingly that a few organic peroxides having a decomposition temperature of over 200° C. exhibit a decomposition temperature of below 200° C. in the presence of metal contained in the metal paste. This result appears to trace back to the fact that the decomposition of these organic peroxides is catalyzed in the metal contained in the metal paste.

It can likewise be preferred that the organic peroxides used according to the invention are liquid at room temperature (20° C.) and normal pressure (1013 hPa).

In especially preferred embodiments, the organic peroxide comprises a compound selected from the group comprising diisobutyryl peroxide, cumol peroxyneodecanoate, 1,1,3,3-tetramethylbutyl peroxyneodecanoate, di-n-propyl peroxydicarbonate, tert-amyl peroxyneodecanoate, di-(2-ethylhexyl)-peroxydicarbonate, tert-butyl peroxyneodecanoate, di-n-butyl peroxydicarbonate, 1,1,3,3-tetramethylbutyl peroxypivalate, tert-butyl peroxyneoheptanoate, tert-amyl peroxypivalate, tert-butyl peroxypivalate, di-(3,5,5-trimethylhexanoyl) peroxide, tert-butyl-peroxy-2-ethylhexanoate, tert-butyl peroxyisobutyrate, 1,1-di-(tert-butylperoxy)-3,3,5-trimethylcyclohexane, 1,1-di-(tert-butylperoxy)-cyclohexane, tert-butyl-peroxy-3,5,5-trimethylhexanoate, 2,2-di-(tert-butylperoxy)-butane, tert-butyl peroxyisopropylcarbonate, tert-butyl peroxyacetate, 2,5-dimethyl-2,5-di(2-ethylhexanoylperoxy)-hexane, 1,1,3,3-tetramethylbutyl peroxy-2-ethylhexanoate, tert-amyl-peroxy-2-ethylhexanoate, tert-butyl peroxydiethylacetate, tert-amyl-peroxy-2-ethylhexylcarbonate, tert-butyl peroxy-2-ethylhexylcarbonate, tert-butyl peroxybenzoate, di-tert-amyl peroxide, 2,5-dimethyl-2,5-di-(tert-butylperoxy)-hexane, tert-butyl cumyl-peroxide, 2,5-dimethyl-2,5-di(tert-butylperoxy)hexyne-3, di-tert-butyl peroxide, 3,6,9-triethyl-3,6,9-trimethyl-1,4,7-triperoxonane, di-isopropylbenzene-monohydroperoxide, p-menthane hydroperoxide, cumol hydroperoxide, dicumyl peroxide, and 1,1,3,3-tetramethylbutyl hydroperoxide.

Furthermore, inorganic peroxides can also be used as sintering agents.

In the scope of the invention, inorganic peroxides are understood to be compounds that contain the peroxide anion $O_2^{2-}$ or the peroxide group —O—O— as well as exclusively inorganic radicals. In the scope of the invention, inorganic peroxides are preferably all peroxides that are not organic peroxides. According to the invention, inorganic radicals are radicals that are linked directly to the peroxide group via an atom different than a carbon atom.

Two inorganic radicals that are connected to a peroxide group of the inorganic peroxide can be of the same or different type.

The linking to the peroxide group can preferably be performed by one or more hydrogen atoms and/or one or more heteroatoms. As the heteroatoms, metal atoms, boron atoms, or nitrogen atoms can be preferred.

If heteroatoms are linked directly to the peroxide group, then the heteroatom can be part of a radical that contains other atoms in addition to the heteroatom. According to a preferred embodiment, these other atoms can comprise carbon atoms, hydrogen atoms, or other heteroatoms, As the other heteroatoms, nitrogen atoms, oxygen atoms, phosphorus atoms, and halogen atoms, in particular fluorine atoms, chlorine atoms, bromine atoms, or iodine atoms can be preferred.

Preferred metal atoms that can be linked directly to the peroxide group are metals of the first, second, and third groups of the periodic table of elements. Consequently, it can be preferred that the lithium atoms, sodium atoms, potassium atoms, beryllium atoms, magnesium atoms, calcium atoms, strontium atoms, boron atoms, or aluminum atoms are linked to the peroxide group.

Preferably, an inorganic radical that is linked via a heteroatom to the peroxide group of the inorganic peroxide comprises an ammonium radical. If two ammonium radicals are connected to a peroxide group in the inorganic peroxide, then the ammonium radicals can be the same or different.

It can also be preferred that one or more hydrogen atoms of the ammonium radical are substituted by organic or inorganic groups. Preferably, in this case one or more hydrogen atoms of the ammonium radical are replaced by alkyl groups. These alkyl groups can be branched or unbranched, but are preferably unbranched. The alkyl groups that substitute for one or more hydrogen atoms of the ammonium radical preferably have 1-10, more preferably 1-6, and even more preferred 1-4 carbon atoms. The alkyl groups that substitute for one or more hydrogen atoms of the ammonium radical can be the same or different.

Preferred inorganic radicals are ammonium radicals, monomethyl ammonium radicals, dimethyl ammonium radicals, trimethyl ammonium radicals, monoethyl ammonium radicals, diethyl ammonium radicals, triethyl ammonium radicals, monopropyl ammonium radicals, dipropyl ammonium radicals, tripropyl ammonium radicals, monoisopropyl ammonium radicals, diisopropyl ammonium radicals, triisopropyl ammonium radicals, monobutyl ammonium radicals, dibutyl ammonium radicals, and tributyl ammonium radicals.

The inorganic peroxide can also comprise a peroxoborate. According to the invention, peroxoborates are understood to be borates in which at least one oxygen atom is replaced by a peroxide group. Borates are salts or esters of boric acid according to the invention. The peroxoborates can preferably also be present as hydrates. Furthermore, the peroxoborates can comprise peroxo salts having ring-shaped anions.

Preferred peroxoborates are ammonium perborates, alkyl ammonium perborates, and alkali perborates.

According to the invention, the term alkyl ammonium perborates includes ammonium perborates in which one or more hydrogen atoms of the ammonium unit are replaced by one or more alkyl groups. These alkyl groups can be branched or unbranched. Preferably, these alkyl groups have 1-10 carbon atoms, more preferably 1-6 carbon atoms, and even more preferred 1-4 carbon atoms.

Preferred alkali perborates are lithium perborate, potassium perborate, and sodium perborate.

The inorganic peroxides used according to the invention preferably have a decomposition temperature of no more than 200° C.

It can be further preferred that the inorganic peroxides used according to the invention are liquid at room temperature (20° C.) and normal pressure (1013 hPa).

According to one especially preferred embodiment, hydrogen peroxide, ammonium peroxide, monomethyl ammonium peroxide, dimethyl ammonium peroxide, trimethyl ammonium peroxide, monoethyl ammonium peroxide, diethyl ammonium peroxide, triethyl ammonium peroxide, monopropyl ammonium peroxide, dipropyl ammonium peroxide, tripropyl ammonium peroxide, monoisopropyl ammonium peroxide, diisopropyl ammonium peroxide, triisopropyl ammonium peroxide, monobutyl ammonium peroxide, dibutyl ammonium peroxide, tributyl ammonium peroxide, lithium peroxide, sodium peroxide, potassium peroxide, magnesium peroxide, calcium peroxide, barium peroxide, ammonium perborate, lithium perborate, potassium perborate, or sodium perborate are used as the inorganic peroxides.

According to one especially preferred embodiment, the inorganic peroxides comprise hydrogen peroxide, ammonium peroxide, sodium peroxide, and ammonium perborate.

Furthermore, inorganic acids can also function as sintering agents contained in the metal paste according to the invention.

Preferably, the inorganic acids comprise oxygen-containing inorganic acids.

According to another preferred embodiment, phosphoric acids are used as the inorganic acids. Phosphoric acids are understood to be, in general, inorganic acids that have at least one phosphorus atom.

Preferred phosphoric acids that can be used as sintering agents according to the invention are orthophosphoric acid, diphosphoric acid, metaphosphoric acids, and polyphosphoric acids.

The sintering agents according to the invention are preferably used as a component of a metal paste that is used in a sintering process. Preferably, in this sintering process components are connected to each other that are in contact with each other via the metal paste in a sandwich arrangement.

The metal pastes used according to the invention can also have other substances in addition to metals, metal precursors, solvents, and sintering agents.

These other substances can preferably comprise substances typically used in metal pastes.

For example, as the other substances, dispersants, surfactants, anti-foaming agents, binding agents, polymers, or viscosity-controlling agents can be contained in the metal paste.

The metal paste according to the invention contains 75-90 weight percent, preferably 77-89 weight percent, more preferably 78-87 weight percent, and even more preferably 78-86 weight percent of at least one of the metals described herein and present in the form of particles of the metals. These weight specifications include the weight of the coating compounds contained on the particles.

The metal paste according to the invention contains 0-12 weight percent, preferably 0.1-12 weight percent, more preferably 1-10 weight percent, and even more preferably 2-8 weight percent of at least one metal precursor.

The metal paste according to the invention contains 6-20 weight percent, preferably 7-18 weight percent, more preferably 8-17 weight percent, and even more preferably 10-15 weight percent of at least one solvent.

The metal paste according to the invention contains 0.1-15 weight percent, preferably 0.1-12 weight percent, more preferably 1-10 weight percent, and even more preferably 1-8 weight percent of at least one of the sintering agents described herein.

The metal paste according to the invention contains 0-15 weight percent, preferably 0-12 weight percent, more preferably 0.1-10 weight percent, and even more preferably 1-10 weight percent of other substances.

Consequently, the metal paste according to the invention contains 75-90 weight percent of at least one of the metals described herein, 0-12 weight percent of at least one metal precursor, 6-20 weight percent of at least one solvent, and 0.1-15 weight percent of at least one of the sintering agents described herein.

According to one preferred embodiment, the metal paste according to the invention contains 77-89 weight percent of at least one of the metals described herein, 0.1-12 weight percent of at least one metal precursor, 7-18 weight percent of at least one solvent, and 0.1-12 weight percent of at least one of the sintering agents described herein.

According to a more preferred embodiment, the metal paste according to the invention contains 78-87 weight percent of at least one of the metals described herein, 0.1-10 weight percent of at least one metal precursor, 8-17 weight percent of at least one solvent, and 1-10 weight percent of at least one of the sintering agents described herein.

According to an even more preferred embodiment, the metal paste according to the invention contains 78-86 weight percent of at least one of the metals described herein, 2-8 weight percent of at least one metal precursor, 10-15 weight percent of at least one solvent, and 1-8 weight percent of at least one of the sintering agents described herein.

According to an especially preferred embodiment, the molar ratio of sintering agents to organic compounds (coating compounds) contained in the coating of the metal particles lies in the range of 1:1 to 100:1, more preferably in the range of 2:1 to 80:1, even more preferably in the range of 5:1 to 80:1, and especially in the range of 10:1 to 70:1. The designation molar ratio of sintering agents to coating compounds according to the invention is understood to be the quotient of (i) the sum of quantities of materials of the sintering agents contained in the metal paste and (ii) the sum of quantities of materials of the coating compounds contained in the coating of the metal particles. If a metal paste contains, e.g., as a sintering agent 0.025 mol dicumyl peroxide and 0.15 mol di-tert-butyl peroxide and as the sole coating compound 0.0008 mol potassium stearate, then the molar ratio of sintering agents to coating compounds equals 50:1.

A ratio of sintering agents to coating compounds in the preferred range according to the invention produces other advantageous effects. On one hand, it is ensured that sufficient carbon monoxide is available for reducing the metal oxides during the sintering process as a result of the combustion of the coating compounds. On the other hand, the quantity of sintering agents is then still not high enough to negatively affect the sintering process.

As explained above, it can be preferred according to the invention if the organic compounds contained in the coating of the metal particles comprise free fatty acids, fatty acid salts, or fatty acid esters, which preferably have 8-24, more preferably 10-24, and even more preferably 12-18 carbon atoms.

If free fatty acids, fatty acid salts, or fatty acid esters having preferably 8-24, more preferably 10-24, and even more preferably 12-18 carbon atoms are contained in the metal paste, not only as coating compounds but also as other substances in the metal paste, then it can be preferred that, for the definition of the molar ratio of sintering agents to coating compounds, the term coating compounds includes, in addition to the fatty acids, fatty acid salts, or fatty acid esters contained on the surface of the metal particles, also the fatty acids, fatty acid salts, or fatty acid esters contained as additional substances in the metal paste.

The metal pastes described herein are used according to the invention in a sintering process.

Sintering is preferably understood to be the joining of two or more components by heating while bypassing the liquid phase.

According to the invention, the joining of two or more components is understood to be the fixing of a first component on a second component. In this context "on" merely means that a surface of the first component is joined to a surface of the second component, wherein it does not involve the relative position of the two components or the arrangement that contains the at least two components.

In the scope of the invention, the term component should preferably include individual parts. These individual parts preferably cannot be further dismantled.

According to special embodiments, parts that are used in high-power electronics are designated as the components.

Accordingly, the components can comprise, for example, diodes, LEDs (light emitting diodes), DCB (direct copper bonded) substrates, leadframes, dies, IGBTs (insulated-gate bipolar transistors), ICs (integrated circuits), sensors, heat sinks (preferably aluminum heat sinks or copper heat sinks), or other passive components (for example resistors, capacitors, or inductors). Preferably, the components can also comprise non-metallic components.

The components to be connected can be the same or different components.

In preferred embodiments, the invention relates to the joining of LEDs to leadframes, of LEDs to ceramic substrates, of dies, diodes, IGBTs, or ICs to leadframes, ceramic substrates or DCB substrates, of sensors to leadframes or ceramic substrates, of DCB or ceramic substrates to copper or aluminum heat sinks, of leadframes to heat sinks, or of tantalum capacitors, preferably in a non-housed state, to leadframes.

In a similarly preferred way, more than two components can be joined to each other. For example, (i) LEDs or chips can be joined to (ii) leadframes and (iii) heat sinks, wherein the leadframes are preferably located between the LEDs or chips and heat sinks. Likewise, a diode can be joined to two heat sinks, wherein the diode is preferably located between the two heat sinks.

According to a preferred embodiment, the components can comprise at least one metallization layer. This metallization layer is preferably part of the component. The metallization layer is preferably located on at least one surface of the component.

The metallization layer can have pure metal. For example, it can be preferred if the metallization layer has at least 50 weight percent, more preferably at least 70 weight percent, even more preferably at least 90 weight percent, or even 100 weight percent of pure metal. The pure metal is preferably selected from the group comprising copper, silver, gold, palladium, and platinum.

On the other hand, the metallization layer can also have an alloy. The alloy of the metallization layer preferably contains at least one metal selected from the group comprising silver, gold, nickel, palladium, and platinum. It can also be preferred that at least two metals selected from the group comprising silver, gold, nickel, palladium, and platinum are contained in the alloy of the metallization layer.

The proportion of elements selected from the group comprising silver, gold, nickel, palladium, and platinum to the alloy preferably equals at least 90 weight percent, more preferably at least 95 weight percent, even more preferably at least 99 weight percent, thus for example 100 weight percent.

According to a preferred embodiment, the metallization layer preferably contains at least 95 weight percent, more preferably at least 99 weight percent, and even more preferably 100 weight percent of this alloy.

The metallization layer can also have a multi-layer structure. For example, it can be preferred if at least one surface of the components to be assembled includes a metallization layer made of several layers, which have the previously mentioned pure metals and/or alloys.

According to a preferred embodiment, at least one metallization layer of a component, in particular a DCB substrate, comprises a layer made of copper on which a layer made of nickel is deposited. Optionally, a gold layer can also be deposited on the nickel layer. In this case, the thickness of the nickel layer preferably equals 1-2 µm and the thickness of the gold layer preferably equals 0.05-0.3 µm. On the other hand, it can be preferred if a metallization layer of a component includes a silver or gold layer and above this a palladium or platinum layer.

According to another preferred embodiment, the individual layers also contain a glass in addition to the mentioned pure metals or alloys. It can also be preferred if the layers are a mixture made of (i) glass and (ii) the pure metals or alloys.

According to the invention, at least two components are joined to each other through sintering.

For this purpose, initially the two or more components are brought into contact with each other. The contacting is here realized by the metal paste according to the invention. For this purpose, an arrangement is provided in which metal paste is located between every two components of the at least two components.

Therefore, if two components, component 1 and component 2, are to be joined to each other, then the metal paste according to the invention is located between component 1 and component 2 before sintering. On the other hand, it is conceivable that more than two components are joined to each other. For example, three components, component 1, component 2, and component 3, can be joined to each other, such that component 2 lies between component 1 and component 3. In this case, the metal paste according to the invention is located both between component 1 and component 2 and also between component 2 and component 3.

According to the invention it is provided that the individual components are present in a sandwich arrangement and are joined to each other.

According to the invention, a sandwich arrangement is understood to be an arrangement in which two components are located one above the other and the components are essentially parallel to each other.

The arrangement made of at least two components and metal paste, with the metal paste being located between the two components of this arrangement, can be manufactured according to a method known from the prior art.

Preferably, at least one surface of a component 1 is provided with the metal paste according to the invention. Then, a different component 2 is placed with one of its surfaces on the metal paste that has been deposited on the surface of component 1.

The deposition of the metal paste on the surface of a component can be performed by conventional methods. Preferably, the deposition of the metal paste is performed by a printing method, for example, by screen printing or stencil printing. On the other hand, the deposition of the metal paste can also be performed by a dispensing, by a spraying technique, by pin transfer, or by dipping.

After the deposition of the metal paste, the surface of this component provided with the metal paste is preferably brought into contact with a surface of the component to be joined via the metal paste. In this way, a layer of metal paste is located between the components to be joined.

The wet layer thickness between the components to be joined preferably lies in the range of 20-200 μm. The wet layer thickness is understood, according to the invention, to be the distance between the opposing surfaces of the components to be joined before the sintering process. The preferred wet layer thickness is dependent on the selected method for the deposition of the metal paste. If the metal paste is deposited, for example, by a screen printing method, then a wet layer thickness of 20-50 μm can be preferred. If the metal paste is deposited by stencil printing, then the preferred wet layer thickness can lie in the range of 50-200 μm.

According to a preferred embodiment, a drying step is performed before the sintering process.

Drying is preferably understood to be a reduction of the proportion of solvent in the metal paste.

According to a preferred embodiment, the proportion of solvent in the metal paste after the drying lies in the range of 1-5 weight percent, based on the weight of the dried metal paste.

The drying can be performed, on one hand, after the production of the arrangement, that is, after the contacting of the components to be joined. On the other hand, the drying can also be performed directly after the deposition of the metal paste on the at least one surface of the component and before the contacting with the component to be joined.

The drying temperature preferably lies in the range of 50-100° C.

It is understood that the drying time is dependent on the respective composition of the metal paste and the size of the arrangement to be sintered. Typical drying times lie in the range of 5-45 minutes.

The arrangement made of the at least two components and metal paste located between the components is finally subjected, according to the invention, to a sintering process.

This sintering process involves a low-temperature sintering process.

According to the invention, a low-temperature sintering process is understood to be a sintering process that preferably takes place at a temperature of less than 200° C.

The processing pressure is preferably less than 30 MPa and more preferably less than 5 MPa. Preferably, the processing pressure lies in the range of 1-30 MPa and more preferably in the range of 1-5 MPa.

The sintering time is dependent on the processing pressure and preferably lies in the range of 2-45 minutes.

According to the invention, the sintering process can take place in an atmosphere that is not further limited. Thus, the sintering can be performed, on one hand, in an atmosphere that contains oxygen. On the other hand, according to the invention it is also possible to perform the sintering in an oxygen-free atmosphere. In the scope of the invention, an oxygen-free atmosphere is understood to be an atmosphere whose oxygen content is no more than 10 ppm, preferably no more than 1 ppm, and even more preferably no more than 0.1 ppm.

The sintering is performed in a conventional device that is suitable for sintering and in which the previously described processing parameters can be set.

The invention is explained below with reference to the Examples that are listed below, but are not to be understood as limiting.

EXAMPLES

1. Production of Metal Pastes

Initially, according to the invention, the metal pastes 1-3 and the comparison paste 1 were produced by mixing the individual components.

1.1 Metal paste 1 according to the invention

A metal paste was produced, which contained 79.7 weight percent coated silver particles having an average particle diameter of 0.5-5 μm (coating quantity: <2 weight percent sodium stearate), 5 weight percent silver oxide, 5.5 weight percent terpineol, 4.3 weight percent tridecanol, and 5.5 weight percent dicumyl peroxide.

1.2 Metal paste 2 according to the invention

A metal paste was produced, which contained 80 weight percent coated silver particles having an average particle diameter of 2-15 μm (coating quantity: <2 weight percent sodium stearate), 5 weight percent silver oxide, 6 weight percent di-tert-butyl peroxide, 5 weight percent terpineol, and 4 weight percent 1-dodecanol.

1.3 Metal paste 3 according to the invention

A metal paste was produced, which contained 80 weight percent coated silver particles having an average particle diameter of 0.5-5 μm (coating quantity: <2 weight percent sodium stearate), 5 weight percent silver carbonate, 6 weight percent di-tert-butyl peroxide, 5 weight percent terpineol, and 4 weight percent 1-isotridecanol.

1.4 Comparison paste 1

A metal paste was produced, which contained 82 weight percent coated silver particles having an average particle diameter of 0.5-5 μm (coating quantity: <2 weight percent sodium stearate), 8.2 weight percent silver oxide, 5.5 weight percent terpineol, and, 4.3 weight percent tridecanol. The comparison paste 1 thus corresponds to the metal paste 1 according to the invention, having the deviation that it does not contain dicumyl peroxide, but instead the proportion of silver particles and silver oxide is increased.

2. Embodiments

The produced metal pastes were used for sintering two components to be joined to each other.

2.1 Embodiment 1

In this example, DCB substrates, each of which has a metallization layer made of silver, and IGBTs, each of which likewise has a metallization layer made of silver, are joined to each other by sintering.

For this purpose, the metal pastes 1-3 according to the invention or the comparison paste 1 were deposited on the metallization layer of the individual DCB substrates by a screen printing method. Then, the individual IGBTs having the metallization layer were placed on the pastes.

In the cases in which the metal pastes 2 and 3 according to the invention were used, a drying of the structure made of the DCB substrate, metal paste, and IGBT was performed at 80°

C. for 20 minutes. In the other cases, drying was not required. In each case, the wet layer thickness equaled 100 µm.

The structure produced in this way was sintered for 20 seconds at a processing pressure of 5 MPa and at different processing temperatures.

2.2 Embodiment 2

This embodiment corresponds to Embodiment 1, having the deviation that the resulting structure was sintered for 15 minutes in a pressure-free environment.

2.3 Embodiment 3

In this example, leadframes, each of which has a metallization layer that consisted of a nickel layer and a gold layer, wherein the gold layer was located on the outer side, and diodes, each of which contained a metallization layer made of silver, were joined to each other by sintering.

For this purpose, the metal pastes 1-3 according to the invention or the comparison paste 1 were deposited on the metallization layer of the individual leadframes by a stencil printing method. Then the individual diodes having the metallization layer were placed on the pastes.

In the cases in which the metal pastes 2 and 3 according to the invention were used, drying of the structure made of the DCB substrate, metal paste, and IGBT was performed at 80° C. for 20 minutes. In the other cases, drying was not required. In each case, the wet layer thickness equaled 100 µm.

The structure produced in this way was sintered for 20 seconds at a processing temperature of 5 MPa and at different processing temperatures.

2.4 Embodiment 4

This embodiment corresponds to embodiment 3, having the deviation that the resulting structure was sintered for 15 minutes in a pressure-free environment.

3 Results

3.1 Embodiments 1 and 3

In the embodiments in which the metal pastes 1-3 according to the invention were used, the sintering temperature was approximately 195° C. in each case. In contrast, the sintering temperature in the embodiment in which the comparison paste 1 was used was approximately 230° C.

3.2 Embodiments 2 and 4

In the embodiments in which the metal pastes 1-3 according to the invention were used, the sintering temperature was approximately 185° C. in each case. In contrast, the sintering temperature in the embodiment in which the comparison paste 1 was used was approximately 230° C.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:
1. A metal sintering paste consisting essentially of:
   (A) 75-90 weight percent of at least one metal present in a form of particles having a coating containing at least one organic compound;
   (B) 0.1-12 weight percent of at least one metal precursor;
   (C) 6-20 weight percent of at least one solvent; and
   (D) 0.1-15 weight percent of at least one sintering agent selected from the group consisting of: (i) organic peroxides, and (ii) inorganic peroxides.

2. The metal sintering paste according to claim 1, wherein the organic peroxide is selected from the group consisting of diisobutyryl peroxide, cumol peroxyneodecanoate, 1,1,3,3-tetramethylbutyl peroxyneodecanoate, di-n-propyl peroxydicarbonate, tert-amyl-peroxyneodecanoate, di-(2-ethylhexyl)-peroxydicarbonate, tert-butyl peroxyneodecanoate, di-n-butyl peroxydicarbonate, 1,1,3,3-tetramethylbutyl peroxypivalate, tert-butyl peroxyneoheptanoate, tert-amyl peroxypivalate, tert-butyl peroxypivalate, di-(3,5,5-trimethylhexanoyl)-peroxide, tert-butyl peroxy-2-ethylhexanoate, tert-butyl peroxyisobutyrate, 1,1-di-(tert-butylperoxy)-3,3,5-trimethylcyclohexane, 1,1-Di-(tert-butyl peroxy)-cyclohexane, tert-butyl peroxy-3,5,5-trimethylhexanoate, 2,2-di-(tert-butyl peroxy)-butane, tert-butyl peroxyisopropylcarbonate, tert-butyl peroxyacetate, 2,5-dimethyl-2,5-di(2-ethylhexanoylperoxy)-hexane, 1,1,3,3-tetramethylbutyl peroxy-2-ethylhexanoate, tert-amyl-peroxy-2-ethylhexanoate, tert-butyl peroxydiethylacetate, tert-amyl-peroxy-2-ethylhexylcarbonate, tert-butyl peroxy-2-ethylhexylcarbonate, tert-butyl peroxybenzoate, di-tert-amyl peroxide, 2,5-dimethyl-2,5-di-(tert-butyl peroxy)-hexane, tert-butyl cumyl peroxide, 2,5-dimethyl-2,5-di(tert-butyl peroxy)hexyne-3, di-tert-butyl peroxide, 3,6,9-triethyl-3,6,9-trimethyl-1,4,7-triperoxonane, di-isopropylbenzene-mono-hydroperoxide, p-menthane hydroperoxide, cumol hydroperoxide, dicumyl peroxide, and 1,1,3,3-tetramethylbutyl hydroperoxide.

3. The metal sintering paste according to claim 1, wherein the inorganic peroxide is selected from the group consisting of hydrogen peroxide, ammonium peroxide, lithium peroxide, sodium peroxide, potassium peroxide, magnesium peroxide, calcium peroxide, barium peroxide, and peroxoborates.

4. The metal sintering paste according to claim 1, wherein the at least one organic compound is selected from the group consisting of free fatty acids, fatty acid salts, and fatty acid esters, each fatty acid having 8-24 carbon atoms.

5. The metal sintering paste according to claim 1, wherein a molar ratio of the at least one sintering agent to the at least one organic compound contained in the coating lies in a range of 1:1 to 100:1.

\* \* \* \* \*